US007038531B2

(12) United States Patent
Cavazzoni

(10) Patent No.: US 7,038,531 B2
(45) Date of Patent: May 2, 2006

(54) ACTIVE FILTER

(76) Inventor: Roberto Cavazzoni, Via Fattori, 47, 42044 Gualtieri (Reggio Emilia) (IT)

( * ) Notice: Subject to any disclaimer, the term of this patent is extended or adjusted under 35 U.S.C. 154(b) by 7 days.

(21) Appl. No.: 10/502,908

(22) PCT Filed: Dec. 23, 2002

(86) PCT No.: PCT/IT02/00820

§ 371 (c)(1),
(2), (4) Date: Jul. 28, 2004

(87) PCT Pub. No.: WO03/065578

PCT Pub. Date: Aug. 7, 2003

(65) Prior Publication Data

US 2005/0116767 A1    Jun. 2, 2005

(30) Foreign Application Priority Data

Jan. 31, 2002   (IT)   .......................... MI2002A0161

(51) Int. Cl.
*H03K 5/00* (2006.01)
(52) U.S. Cl. .................................................... 327/552
(58) Field of Classification Search ........ 327/552–559; 325/552–559; 330/303, 107
See application file for complete search history.

(56) References Cited

U.S. PATENT DOCUMENTS 3,696,252 A * 10/1972 Chapman ................... 327/309
3,919,648 A * 11/1975 Uetrecht .................... 327/555
3,999,137 A   12/1976 Fucito
4,301,419 A * 11/1981 Calomiris .................. 330/107
4,453,132 A    6/1984 Stamler
4,659,995 A *  4/1987 Feistel ....................... 327/555
4,975,653 A * 12/1990 Kennedy et al. ............ 329/318

FOREIGN PATENT DOCUMENTS

IT         1998RE00057 U    12/1998

OTHER PUBLICATIONS

1980 IEEE International Symposium on cas proceedings, Apr. 28-30 1980, Houston Texas: A. Soliman et al: "A universal variable 3-port VCVS and its application in two-integrator loop filters"; pp. 83-86 XP002240261 the whole document.

* cited by examiner

Primary Examiner—Dinh T. Le
(74) Attorney, Agent, or Firm—Pearne & Gordon LLP

(57) ABSTRACT

An active filter comprising a first operational amplifier (10) disposed in an inverting integral configuration through a feedback capacitor (14) and a main resistor (15), and a divider (20) connected through a first connecting terminal (22) thereof with a noninverting input (12) of the first operational amplifier (10). In a second embodiment filter 1 comprises a main operational amplifier (100) dispose in an inverting integral configuration through a capacitor (101) and a resistor (102), and a secondary operational amplifier (110) fed back through feedback means (120) and connected with the main operational amplifier (100) through a resistor (130). An inverting input (110a) of the secondary operational amplifier (110) is connected with a noninverting input (100b) of the main operational amplifier (100).

25 Claims, 10 Drawing Sheets

ACTIVE FILTER

The present invention relates to an active filter and, more particularly, to compensation techniques for parasitic poles generated by the amplifiers utilised in the filter itself.

It is known that in performing circuit analyses, mathematical models are used to describe the behaviour of the different electronic components and calculate the magnitudes of interest relating to the circuit under examination, through appropriate algorithms and functions.

A typical example of the mathematical models utilised is represented by the so-called transfer function that, exactly in a functional manner, describes the relation existing between a signal placed at the input of a given stage and the corresponding signal read at the output.

Obviously, the mathematical models utilised are not able to exactly describe the circuit reality to which they refer; they only constitute rough or approximate descriptions and the accuracy of each model is directly connected with the desired precision in relation to the obtained results.

Generally, the differences between the "real" behaviour of an electronic component and the "ideal" model employed for mathematical simulations relating to such a component; are called "non idealities".

In the specific field of active filters, the most important non idealities are produced by the so-called parasitic poles of the active stages forming the filter itself.

In fact, the behaviour of each operational amplifier is affected by the feedback capacitor internal to the device itself, which is introduced to improve stability of same; consequently, each operational amplifier has a capacitive contribution that is not imposed by the designer, but is intrinsic to the nature of the component and affects operation of the whole system often in a non negligible manner.

In more detail, when resonant active filters are used, the non ideal effects due to said capacitive contribution become of great importance to low frequencies as well, limiting performance and operability of the active and operational stages to a high degree and in particular, performance and operability of high-selectivity filters.

A first solution proposed by the known art in connection with the above described problems is diagrammatically shown in FIG. 1a.

The circuit diagram refers to an operational amplifier disposed in a traditional inverting configuration, with a capacitive load.

Through introduction of an auxiliary capacitor in parallel to the feedback branch (denoted at Cf in FIG. 1a), a phase-lead network is created; in this way, an additional zero is obtained in the stage transfer function (while an additional pole is not obtained since the three capacitors of the circuit diagram in FIG. 1a are disposed within one and the same mesh) capable of compensating for the phase shift introduced by the parasitic pole of the operational amplifier of lower frequency.

In fact, it is known that each operational amplifier working as an open loop generally has two poles: a first pole having a relatively low frequency, in the order of ten Hz, and a second pole of a greater frequency, in the order of ten MHz.

At the moment that the operational amplifier is closed to form a feedback loop, the frequency of this singularity is submitted to the influence of the new circuit components introduced; just as an indication, the two closed-loop poles that are obtained in the general stage transfer function have a frequency of some ten KHz and some MHz, respectively.

The above described compensation method, by introducing a zero of a frequency substantially identical with that of the parasitic pole of lower frequency, therefore succeeds in compensating for the undesired phase contribution of this parasitic pole.

A second compensation technique is diagrammatically shown in FIG. 1b.

This circuit diagram refers to an active filter formed of three stages, each of them being made up of a suitably fed back operational amplifier: in particular, the operational amplifier of the input stage is fed back by a parallel of a capacitor and a resistor, whereas the operational amplifier of the intermediate stage is disposed in a typical inverting configuration; the operational amplifier of the third stage is fed back by a capacitor so as to form a conventional integrating stage.

The additional connection, carried out for compensation purposes, is identified with letter "X" in FIG. 1b.

Said connection "X" generally aims at eliminating the parasitic effects due to one of the active elements present and, more particularly, at limiting the behavioural filter dependence on thermal drifts of the filter components; in fact, it is known that each electronic component varies its behaviour depending on the temperature it has.

In this way, the quality factor Q of the filter is increased making it more precise and selective in the neighbourhood of the operating frequency.

However, this quality factor is at all events rather low (for the particular configuration shown it is of about 83*|A|, wherein A is the open-loop gain) and, correspondingly, the filter is at all events not fully performing.

Further drawbacks shown by the solutions proposed by the known art substantially refer to the fact that these techniques are able to compensate for the non-idealities introduced by a single active stage, without being able to operate in an efficient manner on possible upstream-connected stages.

In other words, by using the known solutions, it is exclusively possible to compensate for the parasitic effects referring to a sole singularity, without on the contrary the possibility of having an influence on the non idealities due to possible other parasitic poles.

In addition, referring to the solution diagrammatically shown in FIG. 1a, it should be pointed out that although introduction of capacitor Cf enables compensation for the phase shift introduced by the parasitic pole of lower frequency, it concurrently introduces other non idealities due to the real capacitor behaviour (which behaviour varies, in a manner not foreseen by the generally utilised models, depending on temperature, frequency and, more generally, the operating conditions of the system).

Therefore, the results obtained with a stage of this type are at all events not very satisfactory and of limited quality.

SUMMARY OF THE INVENTION

It is an aim of the present invention to solve the above described drawbacks.

In particular, it is an aim of the present invention to provide an active filter the "real" behaviour of which is very similar to the "ideal" one.

It is another aim of the present invention of provide an active filter in which the non ideal effects due to the parasitic poles introduced by the amplification stages utilised are compensated for.

It is a further aim of the present invention to provide an active filter in which the effects of a plurality of parasitic poles due to one or more amplification stages connected with each other in cascade or in parallel are compensated for.

A still further aim of the invention is to make available an efficient and functional active filter characterised by a great simplicity from the point of view of circuit implementation and by great savings in terms of manufacturing costs.

The foregoing and yet further aims are substantially achieved by an active filter in accordance with the features recited in the appended claims.

Further features and advantages will become more apparent from the detailed description of a preferred but not exclusive embodiment of an active filter shown in the accompanying drawings, in which.

Figure 1A:
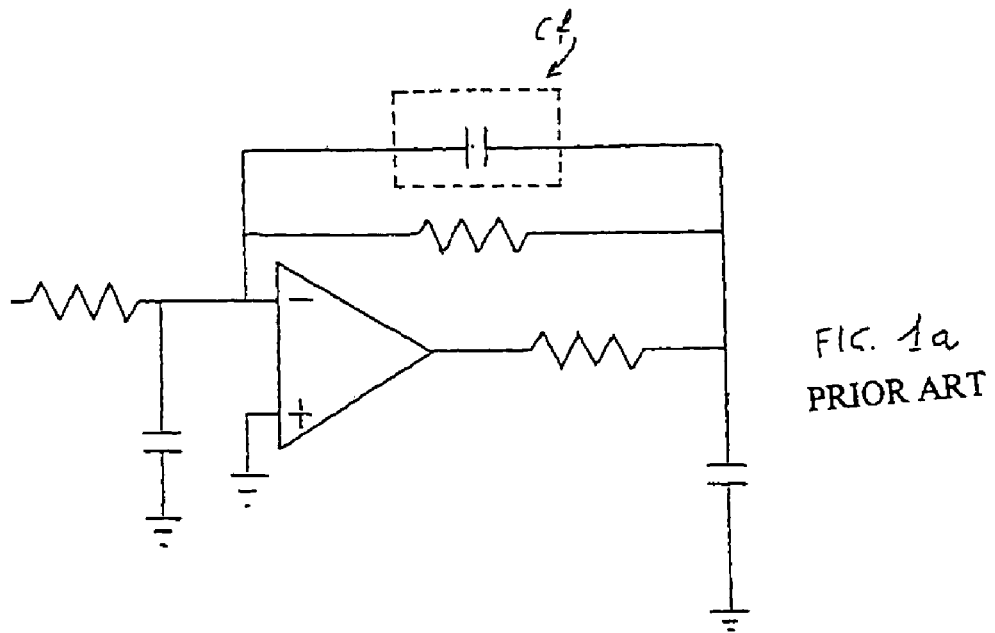
FIGS. 1a and 1b show a circuit diagram of two active filters in accordance with the known art.
Figure 1B:
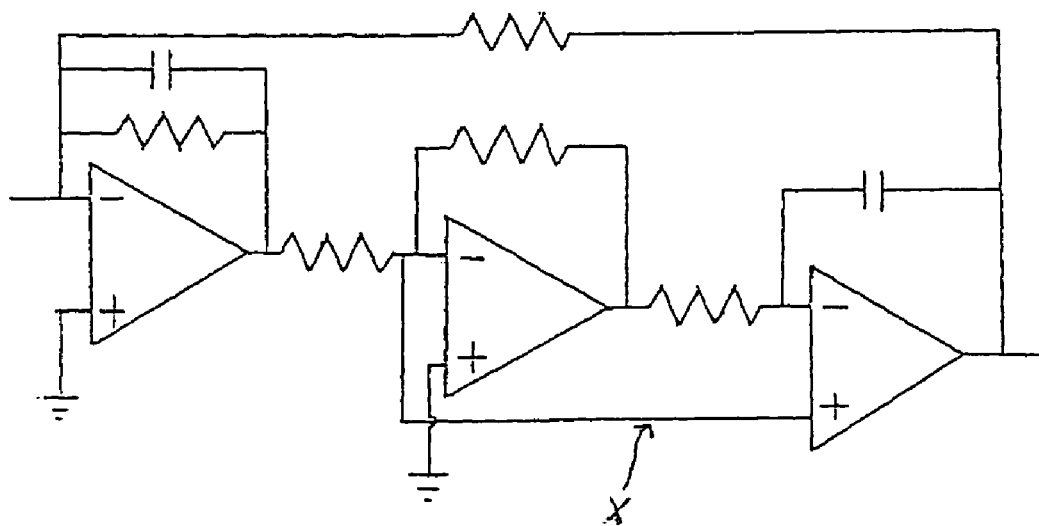

The active filter in accordance with the present invention is generally identified by reference numeral 1 in the accompanying drawings.

Figure 2:
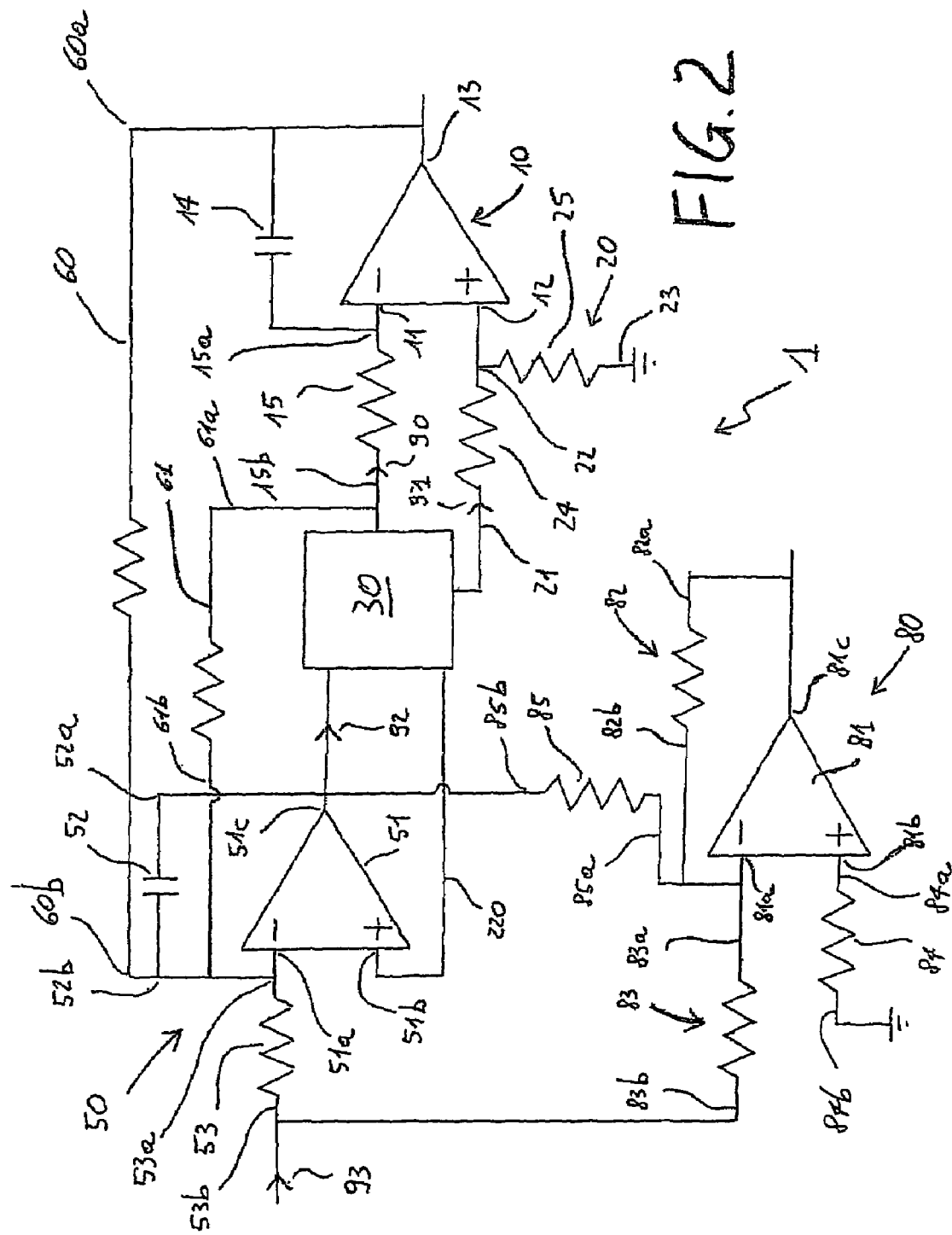
FIG. 2 is a circuit diagram of a first embodiment of an active filter in accordance with the present invention.

Referring particularly to FIG. 2, the active filter 1 first of all comprises a first operational amplifier 10, having an inverting input 11, a noninverting input 12 and an output 13; the first operation amplifier 10 is fed back through a feedback capacitor 14 connected between the output 13 and inverting input 11 of the first operational amplifier 10 itself.

Also provided is a main resistor 15 having one end 15a connected to the inverting input 11 of the first operational amplifier 10, and a second end 15b arranged to receive a main signal 90 that, as better clarified in the following, is generated by the upstream-connected stages of said first operational amplifier 10.

With the first operational amplifier 10, the feedback capacitor 14 and main resistor 15 therefore, the traditional configuration of an inverting integrator is obtained.

The active filter 1 further comprises a divider 20 having an input 21 arranged to receive an auxiliary signal 91, a first connecting terminal 22, connected to the noninverting input 12 of the first operational amplifier 10, and a second connecting terminal 23 connected to a node of fixed potential and preferably to the ground.

Through divider 20 and in particular by means of the connection between the first connecting terminal 22 and the noninverting input 12 of the first operational amplifier 10, a signal is fed to the noninverting input 12 which is a function of said auxiliary signal 91, received by divider 20 through its input 21.

In this way, the operational amplifier 10 and the components associated therewith constitute a differential inverting integral configuration since the stage output to be picked up at the output 13 of the first operational amplifier 10 depends on the difference between the two above mentioned main 90 and auxiliary 91 signals.

Divider 20 can be of the resistive type and correspondingly, the signal fed to the noninverting input 12 of the first operational amplifier 10 through divider 20 can be substantially proportional to the auxiliary signal 91.

In more detail, divider 20 can be a voltage divider; in fact it is known that the input impedance of the operational amplifiers is very high and in many applications can be practically considered as infinite. Consequently the input signals to the operational amplifiers are voltage signals.

To form a resistive voltage divider, divider 20 is provided with a first resistor 24 connected between the input 21 and the first connecting terminal 22 of divider 20 and with a second resistor 25 connected between the first connecting terminal 22 and the second connecting terminal 23.

Therefore, practically the signal fed to the noninverting input 12 of the first operational amplifier 10 corresponds to a voltage drop on the second resistor 25 of divider 20; by suitably calibrating the first resistor 24 and second resistor 25, a signal having a predetermined proportionality ratio with the auxiliary signal 91 can be fed to the noninverting input 12 of the first operational amplifier 10.

In addition, by virtue of the introduction of divider 20, by suitably connecting it to the upstream stages, an additional zero in the transfer function of the integrator formed with the first operational amplifier 10 can be obtained, so that the parasitic poles introduced by the upstream stages and the first operational amplifier 10 can be compensated for.

The hitherto described circuit structure enables an additional phase deviation to be achieved with respect to the ideal phase shift, which appears to be equal and opposite to that produced by the parasitic poles of the operational amplifiers present; through addition of these two equal and opposite contributions, the resulting active filter is given a behaviour which is very close to the ideal one.

It is therefore well apparent that the hitherto shown circuit configuration is able to compensate for the parasitic effects having the features as above stated and introduced by any typology of amplification and/or filtering stage.

A further aspect of interest of the present invention resides in that, by suitably sizing divider 20, compensation can be also carried out for the non ideal effects due to the parasitic zeroes introduced by the feedback capacitors of possible integrating stages present in filter 1.

In the embodiment shown in FIG. 2 a processing stage 30 is provided which is connected upstream of the first operational amplifier 10 and is arranged to generate the main signal 90 and auxiliary signal 91, depending on an input signal 92. Said input signal 92, as better specified in the following, is generated by other circuit stages connected with the processing stage 30 itself.

In a preferred embodiment (FIGS. 2a–2c) the processing stage 30 comprises a second operational amplifier 31 having an inverting input 31a, a noninverting input 31b and an output 31c; output 31c is connected to the second end 15b of the main resistor 15 to feed the main signal 90 to the first operational amplifier 10.

The second operational amplifier 31 is fed back through a feedback element 32 having one end 32a connected to the output 31c of the second operational amplifier 31 and a second end 32b connected to the inverting input 31a of the second operational amplifier 31 itself.

Depending on design requirements, the feedback element 32 can be formed of a resistor and/or a capacitor.

Also provided is an input resistor 33 having one end 33a connected with the inverting input 31a of the second operational amplifier 31, and a second end 31b arranged to receive said input signal 92.

Figure 2A:
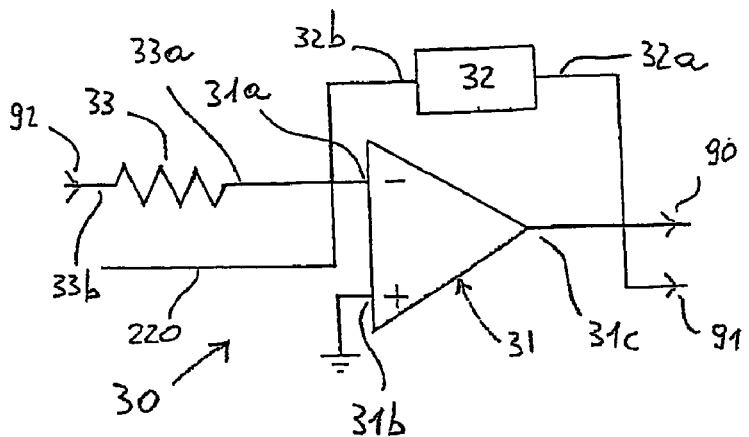
FIGS. 2a, 2b and 2c show possible alternative embodiments of a block of the circuit shown in FIG. 2.

Referring particularly to FIG. 2a, the output 31c of the second operational amplifier 31 is also connected with the input 21 of divider 20; in this way the main signal 90 and auxiliary signal 91 are substantially identical, since they are picked up from the same node, i.e. the output 31c of the second operational amplifier 31.

A technical solution of this type that does not involve introduction of any intermediate element between the output 31c of the second operational amplifier 31 and the input 21 of divider 20, is particularly efficient, should the analysis of the design parameters of the active filter 2 reveal that the main signal 90 and auxiliary signal 91 are to be in phase with each other.

Figure 2B:
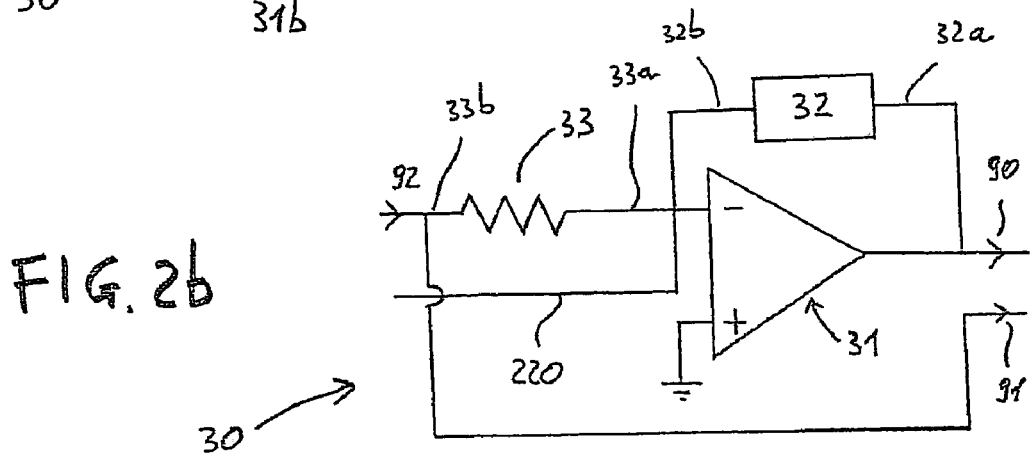
Figure 2C:
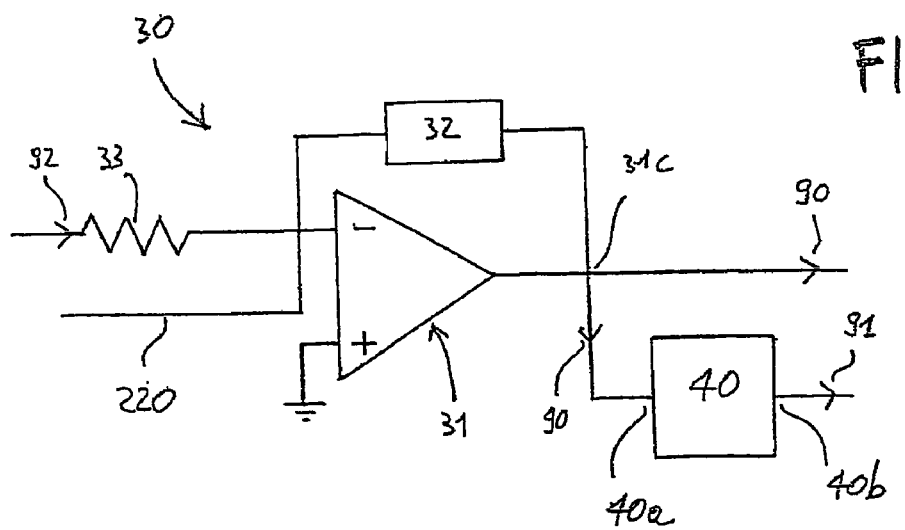

Alternatively, as shown in FIG. 2c, introduction of a phase-shifting block 40 is possible, which has an input 40a connected with the output 31c of the second operational amplifier 31 and an output 40b connected with the input 21 of divider 20.

Through input 40a, the phase-shifting block 40 receives the main signal 90, whereas, through output 40b the phase-shifting block 40 supplies the auxiliary signal 91 to divider 20.

Figure 3A:
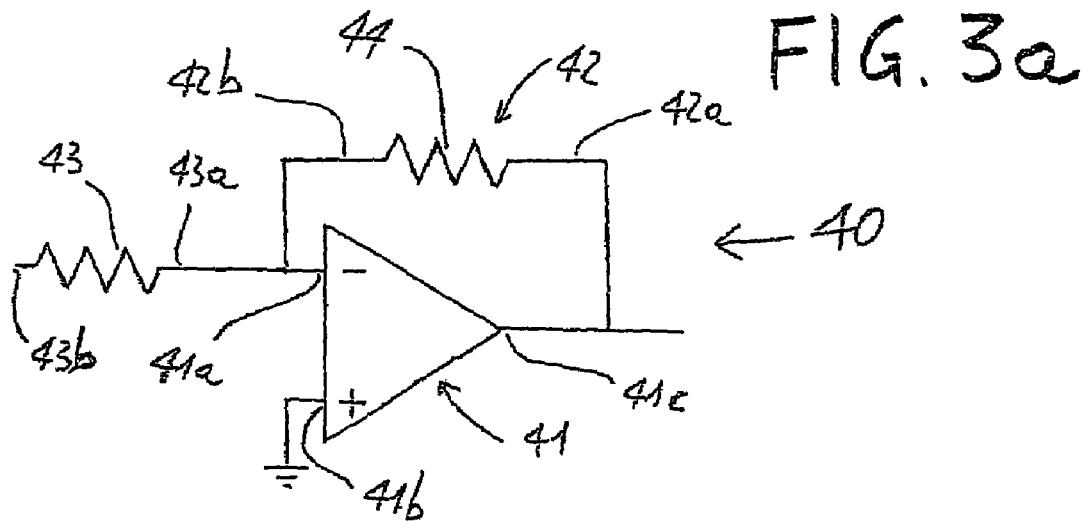
FIGS. 3a and 3b show two possible embodiments of an operating block in FIG. 2c.

The phase-shifting block 40 therefore has the task of generating a preestablished phase shift between the main signal 90 and auxiliary signal 91. In a possible circuit implementation of the phase-shifting block 40, diagrammatically shown in FIGS. 3a and 3b, the shifting block 40 itself can be provided with an auxiliary operational amplifier 41 having an inverting input 41a, a noninverting input 41b and an output 41c.

Said output 41c is connected to the input 21 of divider 20; the auxiliary operational amplifier 41 is fed back through an auxiliary feedback element 42 having one end 42a connected to the output 41c of the operational amplifier 41 and a second end 42b connected to the inverting input 41a of the auxiliary operational amplifier 41.

Also provided is an auxiliary resistor 43 having one end 43a connected with the inverting input 41a of said auxiliary operational amplifier 41 and a second end 43b arranged to receive the main signal 90.

Advantageously, the auxiliary feedback element 42 can be a resistor 44; in this particular case, phase shift between the main signal 90 and auxiliary signal 91 is included between 150° and 210° and in particular corresponds to 180°.

In addition in this case, the main signal 90 and auxiliary signal 91 are proportional to each other.

Figure 3B:
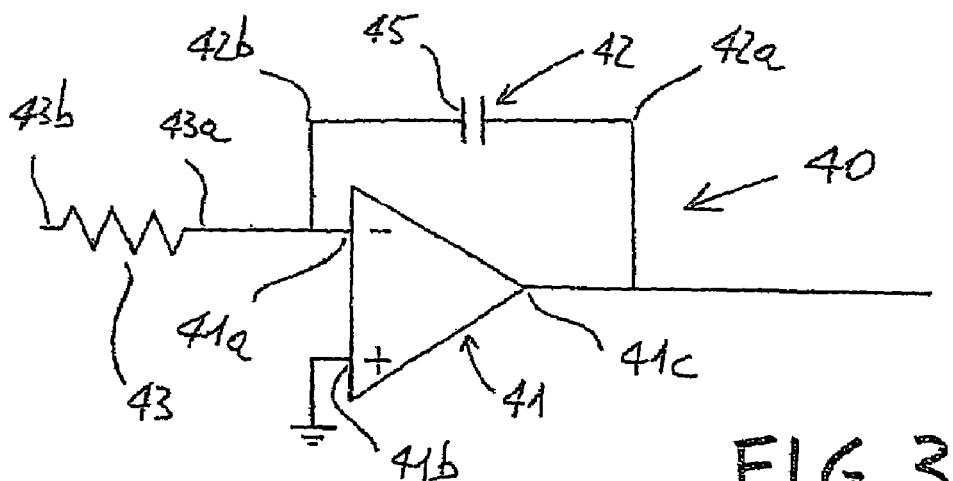

In an alternative embodiment, shown in FIG. 3b, the auxiliary feedback element 42 can be obtained through a capacitor 45; in this second case phase shift between the main signal 90 and auxiliary signal 91 is included between 60° and 120° and in particular corresponds to 90°.

An alternative solution for obtaining an auxiliary signal 91 of opposite sign with respect to the main signal 90 is shown in FIG. 2b: in the last-mentioned configuration, the second end 33b of the input resistor 33 is connected with the input 21 of divider 20; in this way by suitably calibrating the divider value, introduction of the phase-shifting block 40 is made unnecessary.

For carrying out generation of said input signal 92, the active filter 1 is provided with an input stage 50 (FIG. 2) that, upon reception of a source signal 93, outputs the input signal 92 itself.

For closing the total feedback loop and therefore enable an optimal operation of the active filter 1, a total feedback branch 60 is provided (FIG. 2) which has one end 60a connected with the output 13 of the first operational amplifier 10, and a second end 60b connected with an input of said input stage 50.

Advantageously, also provided in the active filter 1 is an auxiliary feedback branch 61 (still shown in FIG. 2) having one end 61a connected with the output 31c of the second operational amplifier 31 and a second end 61b connected with an input of the input stage 50.

In a preferred embodiment shown in FIG. 2, the input stage 50 has the same configuration as a conventional inverting integrator. In fact, the input stage 50 comprises a third operational amplifier 51 having an inverting input 51a, a noninverting input 51b and an output 51c; the third operational amplifier 51 is fed back through a capacitor 52 having one end 52a connected to the output 51c of the operational amplifier 51 and a second end 52b connected to the inverting input 51a of the operational amplifier 51 itself.

In addition, the input stage 50 comprises a resistor 53 having one end 53a connected to the inverting input 51a of the operational amplifier 51 and a second end 53b arranged to receive said source signal 93.

In this particular case both the second end 60b of the total feedback branch 60 and the second end 61b of the auxiliary feedback branch are connected with the inverting input 51a of the third operational amplifier 51.

Through the hitherto described circuit components an active filter is obtained which consists of three stages connected in cascade with each other: the input stage 50, processing stage 30 and last stage which is made up of the first operational amplifier 10 and the passive components associated therewith.

If the source signal 93 is considered as an input signal within filter 1, at the output 51c of the third operational amplifier 51 an output of the band-pass type is obtained which is 180° out of phase with respect to said source signal 93; downstream of the processing stage 30, at the output 31c of the second operational amplifier 31, an output of the band-pass type is obtained with a substantially null phase shift with respect to said source signal 93.

Finally, at the output 13 of the first operational amplifier 10 an output of the low-pass type can be picked up which is 90° out of phase with respect to the source signal 93.

As above mentioned, due to introduction of divider 20 it is possible to compensate for the non-idealities introduced from the stages connected upstream of the first operational amplifier 10, those non-idealities resulting from said first operational amplifier being included as well.

In fact, divider 20 by picking up the output of the input stage 50 or the output from the processing stage 30, and making differential the last integrator stage consisting of the first operational amplifier 10, enables introduction of the additional zero into the transfer function of the integrator obtained with the first operational amplifier 10 itself, thus compensating for the non ideal phase shifts introduced by the parasitic poles of said input and processing stages, 50 and 30, and by the first operational amplifier 10.

In particular, by suitably sizing the first resistor 24 and second resistor 25 a particularly precise and accurate compensation can be obtained which gives the filter a very precise and reliable behaviour.

The relation linking the value of the resistance of the first resistor 24 and the resistance of the second resistor 25 is the following:

$$R1 = R2 * \left[\frac{1}{|Kax|} - 1\right]$$

wherein:
R1 is the resistance value of the first resistor 24;
R2 is the resistance value of the second resistor 25;
Kax corresponds to −Kc*Kaptpt, wherein Kc is a proportionality constant and Kaptpt is calculated as follows:

$$Kaptpt = \frac{1}{w*R*C*tg(j1' - j1 + j2' - j2 + 90°) + 1}$$

wherein:
w is the work frequency;
R is the resistance value of the main resistor 15;
C is the capacitance value of the feedback capacitor 14;
j1' is the real phase shift produced by the transfer function of the input stage 50, preferably evaluated with exclusion of resistor 53 and opening of the secondary feedback loop 60 at the first end 60*a* thereof;
j2' is the real phase shift produced by the transfer function of the processing stage 30;
j2 is the ideal phase shift of the transfer function of the processing stage 30.

In order to also take into account the stage obtained with the first operational amplifier 10, the formula denominator for calculation of Kaptpt becomes:

$$w*R*C*tg(j1'-j1+j2'-j2+j3')+1$$

wherein the newly introduced symbol, j3', represents the real phase shift produced by the stage obtained with the first operational amplifier 10.

It should be pointed out that Kax is the total transfer value of the noninverting section of the first operational amplifier 10. This value is calculated as above described should the noninverting input 12 of the first operational amplifier 10 be connected, in the circuit on which operation takes place, with the ground (or, in general, should transfer of the noninverting section of the first operational amplifier 10 be null).

On the contrary, should processing take place on an already existing or already shaped circuit having the first operational amplifier 10 in a differential inverting integral configuration—i.e. there is a non null transfer of the noninverting section of the first operational amplifier 10—the Kax value is calculated as the difference between the Kax' value of the already present transfer relating to the noninverting section of the first operational amplifier 10, and the value of the Kaptpt parameter calculated as above stated. In the last-mentioned case therefore the following relation is valid:

$$Kax=Kax'-(Kc*Kaptpt).$$

In order to complete the active filter 1 functionality and increase its possibilities of use, the active filter 1 further comprises a secondary stage 80 connected with the input stage 50 and provided with a fourth operational amplifier 81 having an inverting input 81*a*, a noninverting input 81*b* and an output 81*c*.

A first resistor 82 is employed to feed back the fourth operational amplifier; in fact, the first resistor 82 has one end 82*a* connected with the output 81*c* of the fourth operational amplifier 81 and a second end 82*b* connected with the inverting input 81*a* of the fourth operational amplifier 81 itself.

A second resistor 83 is employed to receive said source signal 93; in fact, the second resistor 83 has one end 83*a* connected with the inverting input 81*a* of the fourth operational amplifier 81 and a second end connected with the second end 53*b* of the resistor 53 of the input stage 50.

A third resistor 84 is connected between the noninverting input 81*b* of the fourth operational amplifier 81 and a node of fixed potential, preferably to the ground.

In fact, the third resistor 84 has one end 84*a* connected to the noninverting input 81*b* of the fourth operational amplifier 81 and a second end 84*b* connected to said fixed-potential node.

In addition, to pick up the output of the input stage 50, a fourth resistor 85 is provided which has one end 85*a* connected with the inverting input 81*a* of the fourth operational amplifier 81 and a second end 85*b* connected with the output 51*c* of the third operational amplifier 51.

In this way, since through the secondary stage 80 a difference with change of sign is carried out between the source signal 93 and the input signal 92 (picked up from the input and output of the input stage 50, respectively), at the output of said secondary stage 80 an output of the notch type can be obtained which is 180° out of phase with respect to the source signal 93.

Figure 4:
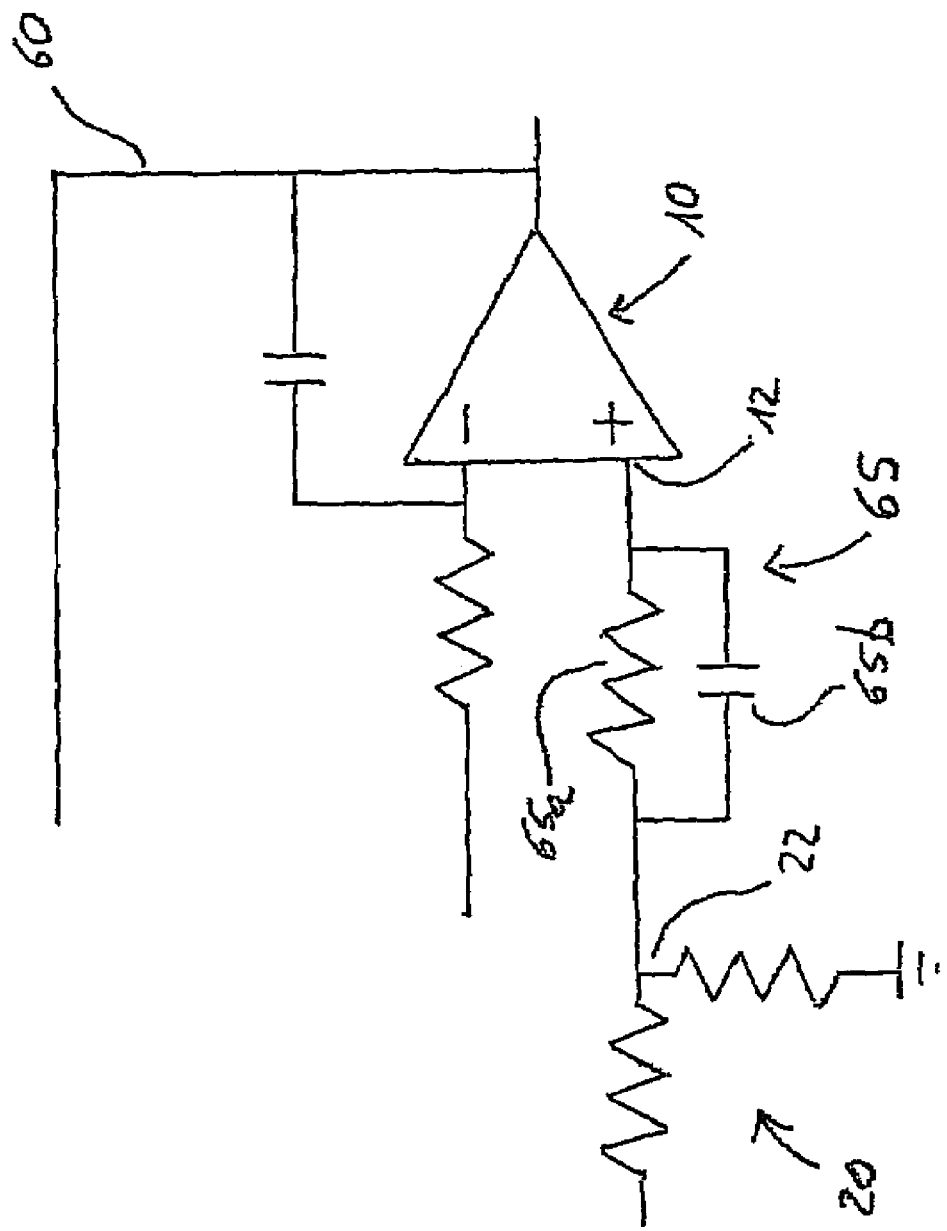
FIG. 4 shows an alternative embodiment of a stage of the circuit shown in FIG. 2.

A further expedient to improve performance of the active filter 1 consists in introducing a correcting block 65 associated with the first operational amplifier 10 (see FIG. 4).

The task of the correcting block 65 is to compensate for offsetting of said first operational amplifier 10; in fact it is known that due to intrinsic asymmetries of the circuit elements forming an operational amplifier, the operational amplifier output in the absence of an input signal is not exactly null.

To eliminate this drawback, the correcting block 65 is provided with a resistor 65*a* and a capacitor 65*b* connected in parallel with each other.

In particular, resistor 65*a* and capacitor 65*b* are interposed between the noninverting input 12 of the first operational amplifier 10 and the first connecting terminal 22 of divider 20.

To further improve performance of the active filter 1, the noninverting input 51*b* of the third operational amplifier 51 can be connected with the inverting input 31*a* of the second operational amplifier 31; advantageously, this linking is obtained through a direct connection 220 (see FIGS. 2 to 2*c*).

In this way, by picking up the signal on the inverting terminal 31*a* of the second operational amplifier 31 and return it to the noninverting input 51*b* of the third operational amplifier 51, a further feedback relating to the input stage 50 is obtained that enables to compensate in a more efficient manner for the non idealities introduced by the input stage 50 itself.

It is important to notice that, should not the main signal 90 be phase shifted with respect to the input signal 92, the output 51*c* of the third operational amplifier 51 can be directly connected with the second end 15*b* of the main resistor 15.

In addition to the above, the active filter 1 can be provided with an output stage 70 (FIG. 7) having an input 70*a* connected with the output 13 of the first operational amplifier 10 and an output 70 to feed a corresponding output signal 94.

Conveniently, the output stage 70 can be made like an inverting operational stage provided with an appropriate input resistor and a respective feedback resistor.

Figure 7:
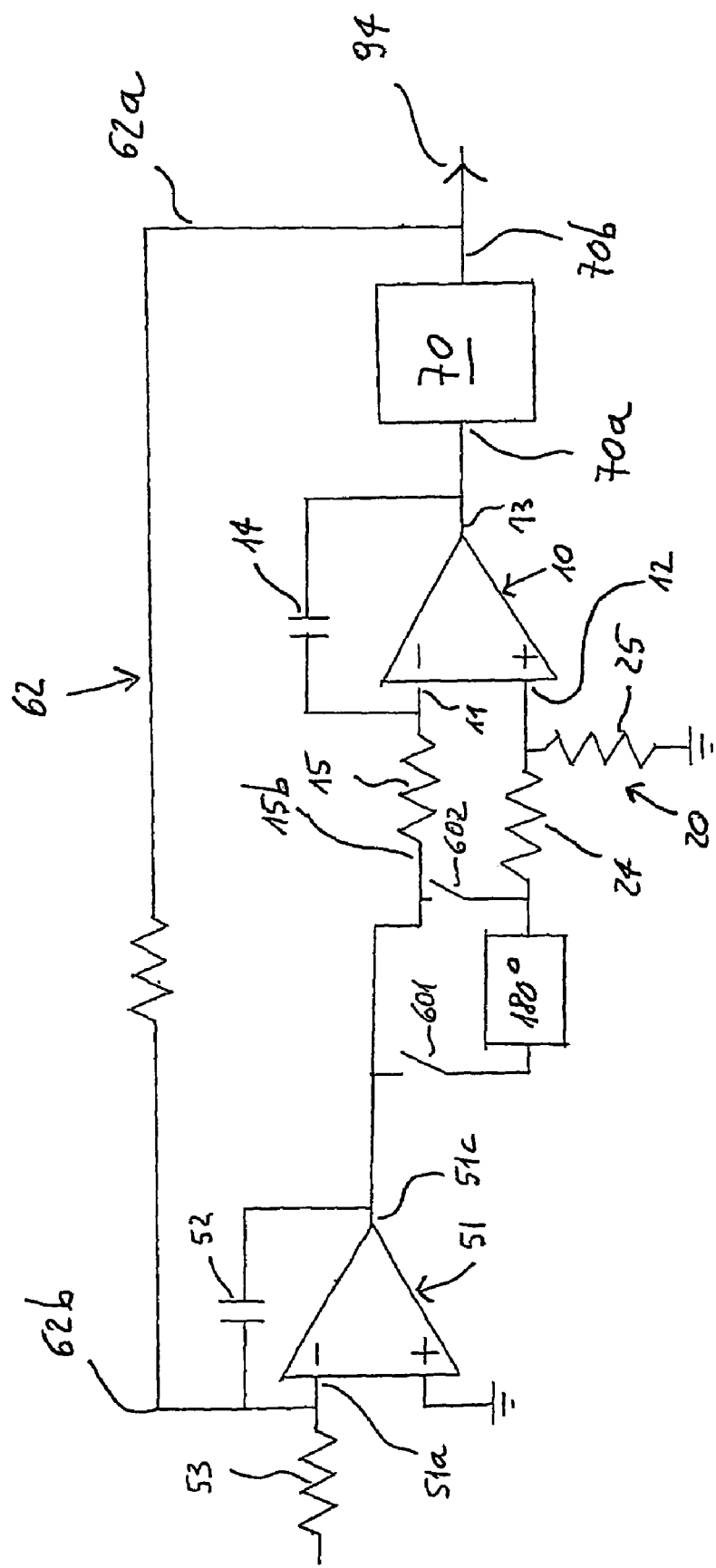
FIG. 7 shows an alternative embodiment of the filter seen in FIG. 2.

Still referring to FIG. 7, the active filter 1 further comprises a secondary feedback branch 62 having one end 62a connected with the output 70b of the output stage 70 and a second end 62b connected with the inverting input 51a of the third operational amplifier 51.

Preferably, the secondary feedback branch 62 is made by means of a resistor.

It should be recognised that the configuration hitherto described in its different embodiments (FIGS. 2–4, 7) is given by way of example only due to the fact that, in addition to the single input stage 50, connection of a plurality of auxiliary input stages can take place the outputs of which lead to the inverting input 31a of the second operational amplifier 31 or to the inverting input 11 of the first operational amplifier, if the processing stage 30 is not employed.

Inputs of the different input stages in fact are added in the node identified by the inverting input 31a or the inverting input 11 so that the output signal is a function of the sum of all inputs.

In addition, due to divider 20 (with which one or more auxiliary dividers can be associated, each of them being arranged to return a preestablished fraction of the output signal from a respective input stage to the noninverting input 31b of the second operational amplifier 31 or the noninverting input 12 of the first operational amplifier 10), the parasitic effects of all the operational amplifiers employed can be compensated for.

From the point of view of operation, the following is to be pointed out.

When the source signal 93 is inputted to the input stage 50, said input stage integrates it due to capacitor 52 and resistor 53, thereby obtaining the input signal 92.

The input signal 92 is fed both to the processing stage 30 and the fourth operational amplifier 81, in particular to the inverting input 81a thereof.

The processing stage 30 carries out generation of the main signal 90 and auxiliary signal 91, depending on the received input signal 92; as above described, depending on the circuit configurations that the processing stage 30 can take (FIGS. 2a–2c), the main signal 90 and auxiliary signal 91 will be able to be substantially coincident (FIG. 2a), mutually proportional and about 180° out of phase (FIG. 2b or 2c), or about 90° out of phase, being the auxiliary signal 91 the integral of the main signal 90 (FIG. 2c).

It is important to point out that the signal present on the inverting input 31a of the second operational amplifier 31 is returned to the noninverting input 51b of the third operational amplifier 51, through said direct connection 220. In this way, due to the additional feedback loop obtained, the circuit performance is greatly improved, in particular as regards compensation for non idealities introduced by said operational amplifiers.

Use of the direct connection 220 also offers the advantage of a substantially ideal voltage reading as regards tension present on the inverting input 31a of the second operational amplifier 31, since the input resistance of an operational amplifier is generally very high; consequently, the non inverting input 51b of the third operational amplifier 51 does not absorb current from the node defined by the inverting input 31a of the second operational amplifier 31.

Subsequently, the main signal 90 is fed to the inverting input 11 of the first operational amplifier 10, while the auxiliary signal 91 is inputted to divider 20, so that a signal substantially proportional to the auxiliary signal 91 should be arranged on the noninverting input 12 of the first operational amplifier 10.

Divider 20, through association with the capacities leading to its terminals (the first 22 and second 23 terminals) generates an additional zero the cutoff frequency of which depends on how the circuit components are sized, and which is capable of compensating for the real phase shift due to the parasitic poles of the different operational amplifiers.

Finally, the first operational amplifier 10 carries out integration of the difference between the received signals by means of the feedback capacitor 14 and supplies an output of the low-pass type which is 90° out of phase with respect to the source signal 93.

As above mentioned, the fourth operational amplifier 81 carries out the difference and sign inversion between the source signal 93 and input signal 92 supplying an output of the notch type which is 180° out of phase with respect to the source signal 93.

In the alternative embodiment shown in FIG. 7 the processing stage 30 consists of a single phase-shifting block—in particular a sign inverter—connected between the input stage 50 and divider 20. As can be inferred from the presence of two switches 601, 602, this phase-shifting block can be used or not depending on whether the main signal 90 (directly obtained from the input signal 92) and the auxiliary signal 91 are to be in phase or 180° out of phase.

After the first operational amplifier 10 has carried out processing of the received signals, the output stage 70 outputs the processing result, also enabling the total feedback loop to be closed by means of the secondary feedback branch 62.

The particular connection between the inverting input 31a of the second operational amplifier 31 and the noninverting input 51b of the third operational amplifier 51, due to its great simplicity and effectiveness, can be also employed separately from the remainder of the hitherto proposed technical solution involving introduction of said divider 20.

Figure 5:
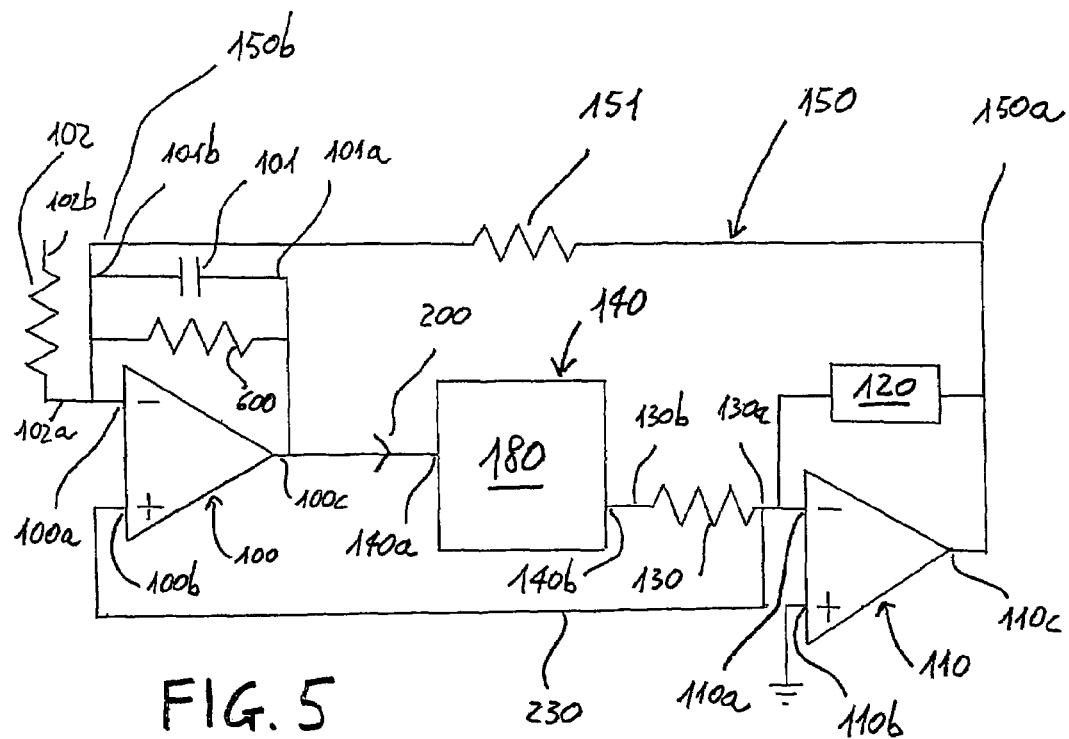
FIG. 5 shows an alternative embodiment of the filter in accordance with the present invention.

In fact, as can be viewed from FIG. 5 showing an alternative embodiment of the present invention, the active filter 1 may comprise a main operational amplifier 100 having an inverting input 100a, a noninverting input 100b and an output 100c.

The main operational amplifier 100 is fed back through a capacitor 101 having one end 101a connected to the output 100c of the main operational amplifier 100 and a second end 101b connected to the inverting input 100a of the main operational amplifier 100 itself. In addition, a resistor 102 is connected at one end 102a thereof with the inverting input 100a of the main operational amplifier 100.

Conveniently, a resistor 600 can be connected in parallel to capacitor 101.

Downstream of the main operational amplifier 100, a secondary operational amplifier 110 is provided which has an inverting input 110a, a noninverting input 110b and an output 100c; the secondary operational amplifier 110 is fed back through feedback means 120 connected between the output 110c of said secondary operational amplifier 110 and the inverting input 110a of the secondary operational amplifier 110 itself.

The feedback means 120, depending on the functional requirements of the system, may comprise a resistor and/or a capacitor.

In the same manner as with the other stages, a resistor 130 is also provided which has one end 130a connected to the inverting input 110a of the secondary operational amplifier 110 and a second end 130b connected to the output 100c of the main operational amplifier 100 itself.

It is important to point out that connection between the output 100c of the main operational amplifier 100 and the second end 130b of resistor 130 can be both a direct connection (practically obtained through a short-circuit) and a connection made by means of further circuit blocks (such as the intermediate stage 140 to be described later on, for example).

As above mentioned, the noninverting input 100b of the main operational amplifier 100 is connected with the inverting input 110a of the secondary operational amplifier; preferably this linking is obtained by a direct connection 230.

The active filter 1 further comprises an intermediate stage 140 having an input 140a connected to the output 100c of the main operational amplifier 100 and an output 140b connected to the second end 130b of resistor 130.

The intermediate stage 140 has the task of inputting a first signal 200 generated by the main operational amplifier 100 and consequently generating a corresponding second signal 210, destined to the secondary operational amplifier 110.

Advantageously, the intermediate stage 140 comprises a phase-shifting block 180 to obtain a predetermined phase shift between the first signal 200 and second signal 210.

Conveniently, phase shift between said signals is included between 150° and 210° and in particular it can be of 180°.

In an alternative embodiment, this phase shift can be in the range of 60° to 120° and in particular it may correspond to 90°; in this particular case the intermediate stage 140 can be an ideal inverting integrator whereas the secondary operational amplifier 110 is a conventional inverting amplifier. In addition, the direct connection 230 keeps unchanged.

In a possible embodiment of the phase-shifting block 180 the latter is provided with an intermediate operational amplifier 170 having an inverting input 170a, a noninverting input 170b and an output 170c; the intermediate operational amplifier 170 is fed back by means of a feedback element 171, preferably a resistor or a capacitor, connected between the output 170c and the inverting input 170a of said intermediate operational amplifier 170.

A resistor 172 is connected between the intermediate operational amplifier 170 and the main operational amplifier 100.

In fact, the resistor 172 has one end 172a connected to the inverting input 170a of the intermediate operational amplifier 170 and a second end 172b connected to the output 100c of the main operational amplifier 100.

The output 170c of the intermediate operational amplifier 170 is connected with the second end 130b of resistor 130 such as to feed said second signal to the secondary operational amplifier 110.

Practically, the output 170c of the intermediate operational amplifier 170 is coincident with the output 140b of the intermediate stage 140.

In addition, in order to exploit a further feedback between the intermediate stage 140 and the main operational amplifier 100, the noninverting input 170b of the intermediate operational amplifier 170 is connected with the inverting input 110a of the secondary operational amplifier 110; this linking is preferably obtained by a direct connection 240.

Figure 5A:
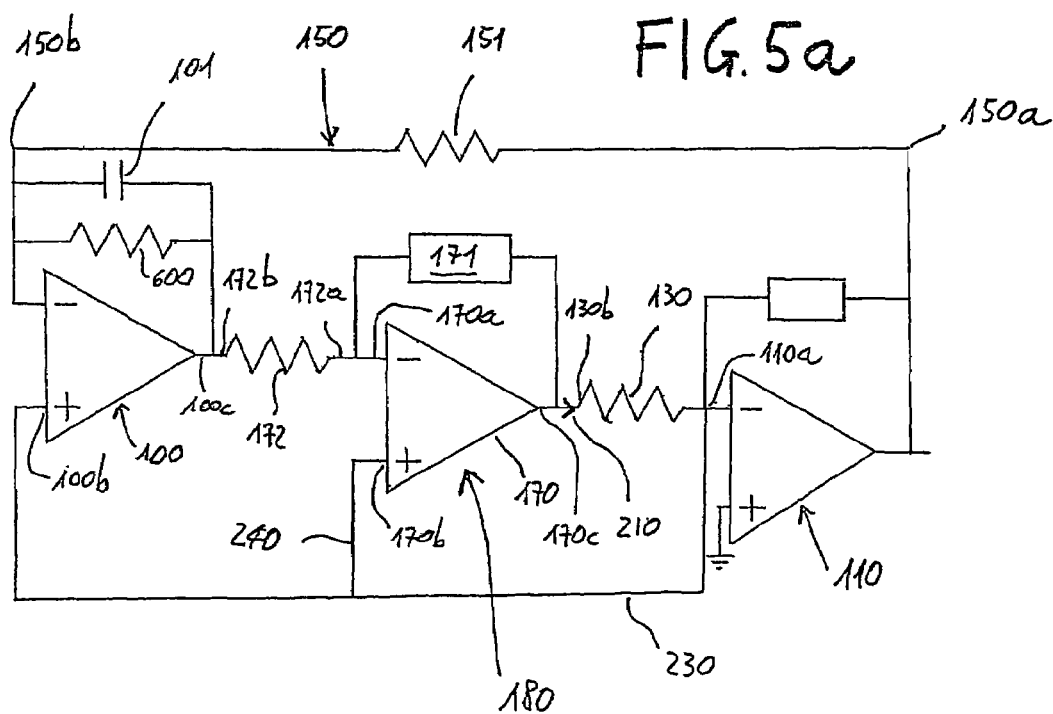
FIGS. 5a and 6 show two alternative embodiments of the filter seen in FIG. 5.

In this way, as can be seen in FIG. 5a, a single direct connection is obtained that starts from the noninverting input 100b of the operational amplifier 100, is connected with the noninverting input 170b of the intermediate operational amplifier 170 and closes onto the inverting input 110a of the secondary operational amplifier 110.

As can be viewed from FIGS. 5 and 5a, the active filter 1 further comprises a feedback branch 150 having one end 150a connected to the output 110c of the secondary operational amplifier 110 and a second end 150b connected to the inverting input 100a of the main operational amplifier 100.

Advantageously, the feedback branch 150 is provided with a resistor 151.

In combination with or as an alternative to said intermediate stage 140, the active filter 1 can be further provided with an output operational amplifier 160 (FIG. 6) having an inverting input 160a, a noninverting input 160b and an output 160c.

The output operational amplifier 160 is fed back through a feedback component 161, preferably a capacitor or a resistor, connected between the output 160c and the inverting input 160a of the output operational amplifier 160 itself.

In addition, a resistor 162 is interposed between the secondary operational amplifier 110 and the output operational amplifier 160; in fact, resistor 162 has one end 162a connected to the inverting input 160a of the output operational amplifier 160 and a second end 162b connected to the output 110c of the secondary operational amplifier 110.

For the purpose of further improving the active filter 1 performance, the noninverting input 110b of the secondary operational amplifier 110 can be connected, preferably in a direct manner, with the inverting input 160a of the output operational amplifier 160. Conveniently, this linking is made through a direct connection 250.

In this way a combination can be carried out between the feedback obtained through connection between the inverting input 110a of the secondary operational amplifier 110 and the noninverting input 100b of the operational amplifier 100, and the feedback obtained through connection between the inverting input 160a of the output operational amplifier 160 and the noninverting input 110b of the secondary operational amplifier 110.

In order to insert the output operational amplifier 160 too in a total feedback loop, the active filter 1 is provided to further comprise a second feedback branch 163 (FIG. 6) having one end 163a connected with the output 160c of the output operational amplifier 160 and a second end 163b connected with the inverting input 100a of the main operational amplifier 100.

Advantageously the second feedback branch 163 is provided with a resistor 164.

Operation of the above described alternative embodiment (illustrated in FIGS. 5, 5a and 6) is quite similar to that of the first embodiment, except for contribution given by divider 20.

Upon reception of an input signal from the main operational amplifier 100, the active filter 1, exactly by means of the main operational amplifier 100 and the passive elements connected therewith carries out integration of such a signal and the first signal 200 is obtained; the latter can be sent to the secondary operational amplifier 110 either directly (FIG. 6), or through the intermediate stage 180 (FIGS. 5, 5a). Typically, the last-mentioned technical solution is implemented, in the case in which a 180° phase shift is wished to be created between the first and second signals 200, 210.

At all events, the auxiliary signal 210 is inputted to the secondary operational amplifier 110 through resistor 130; in addition, the signal present on the inverting input 110a of the secondary operational amplifier 110 is returned, using the above described circuit expedients, to the noninverting input 100b of the main operational amplifier 100 and the noninverting input 170b of the intermediate operational amplifier 170, if present (FIG. 5a). In this way an additional feedback is carried out exploiting the noninverting inputs of the two first stages otherwise connected to the ground, and enabling surprising compensating effects to be reached.

Figure 6:
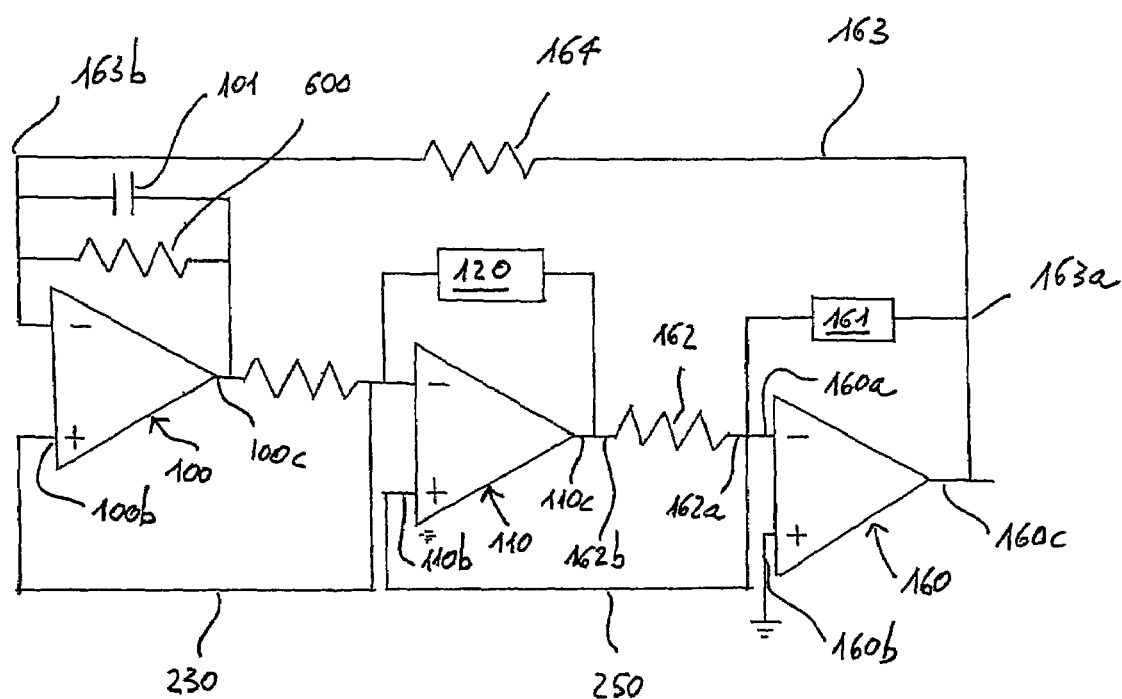

Alternatively, as shown in FIG. 6, two different additional feedback loops can be made: the first one enables the signal present on the inverting input 110*a* of the secondary operational amplifier 110 to be returned to the noninverting input 100*b* of the main operational amplifier 100, whereas the second one returns the signal present on the inverting input 160*a* of the output operational amplifier 160 to the noninverting input 110*b* of the secondary operational amplifier 110.

As regards said direct connections 230, 240 and 250, the same remarks made in relation to the direct connection 220 are valid.

In fact, each of these direct connections enables reading of a very high-impedance voltage allowing a voltage value practically identical with that really present on the node of interest to be returned to the upstream stage.

In a further alternative embodiment of the circuit shown in FIG. 5 the intermediate stage 140 is provided to have a first connecting operational amplifier 300 (FIGS. 8*a* and 8*b*), arranged in a differential inverting integral configuration. In fact, a feedback capacitor 310 is connected between an output 300*c* and an inverting input 300*a* of the first connecting operational amplifier 300, whereas an input resistor 320 has one end 320*a* connected with the inverting input 300*a* of the first operational amplifier 300 and a second end 320*b* connected with the output 100*c* of the main operational amplifier 100.

In this way, at the output 300*c* of the first connecting operational amplifier 300 an output of the low-pass type can be obtained.

In order to improve the active filter 1 performance, connecting means 400 is interposed between the output 100*c* of the main operational amplifier and the noninverting input 300*b* of the first connecting operational amplifier 300, in order to feed a correcting signal directed to obtain compensation for undesired non ideal effects to such a noninverting input 300*b*.

Figure 8A:
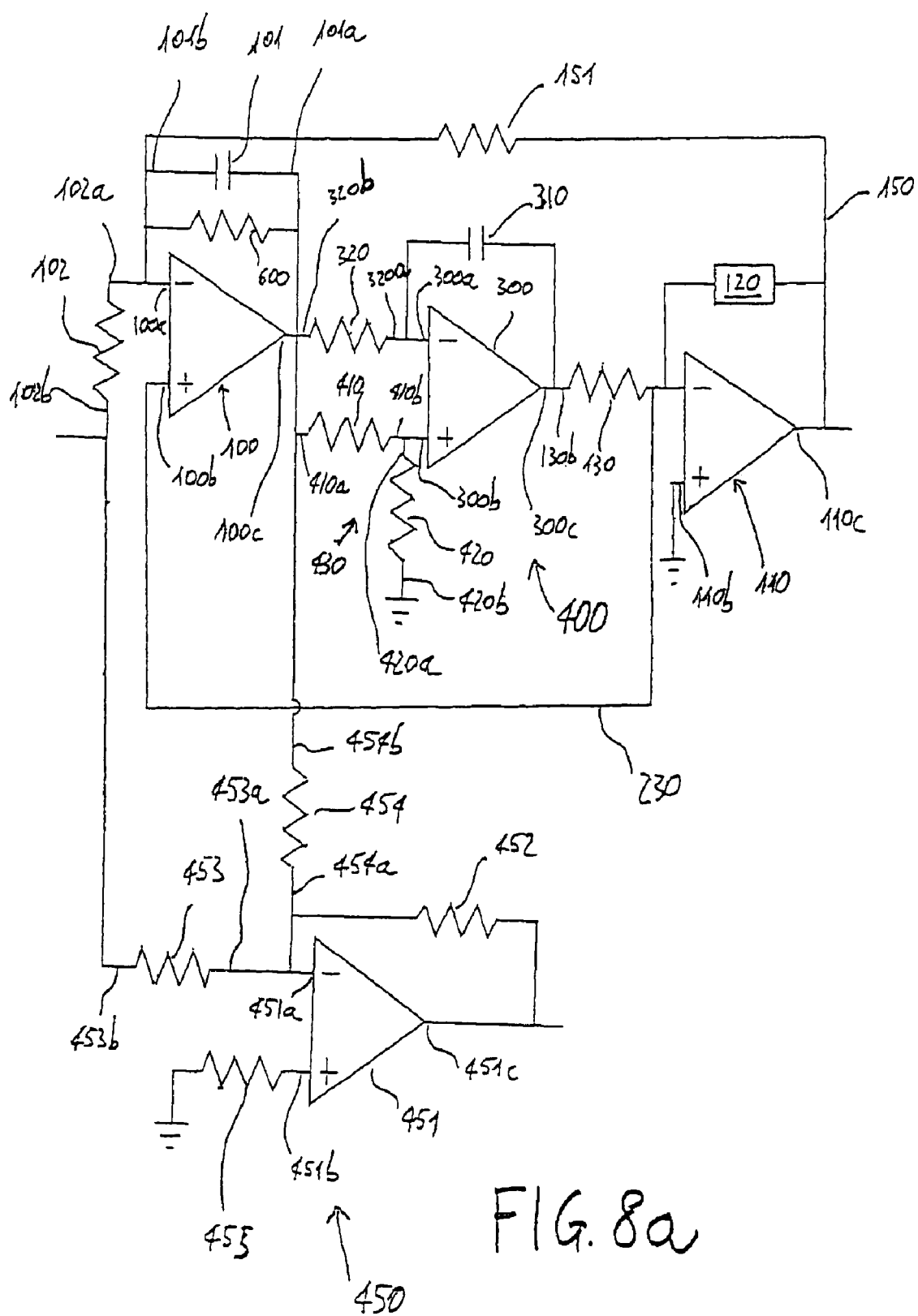
FIGS. 8a and 8b show two further alternative embodiments of the circuit in FIG. 5.
Figure 8B:
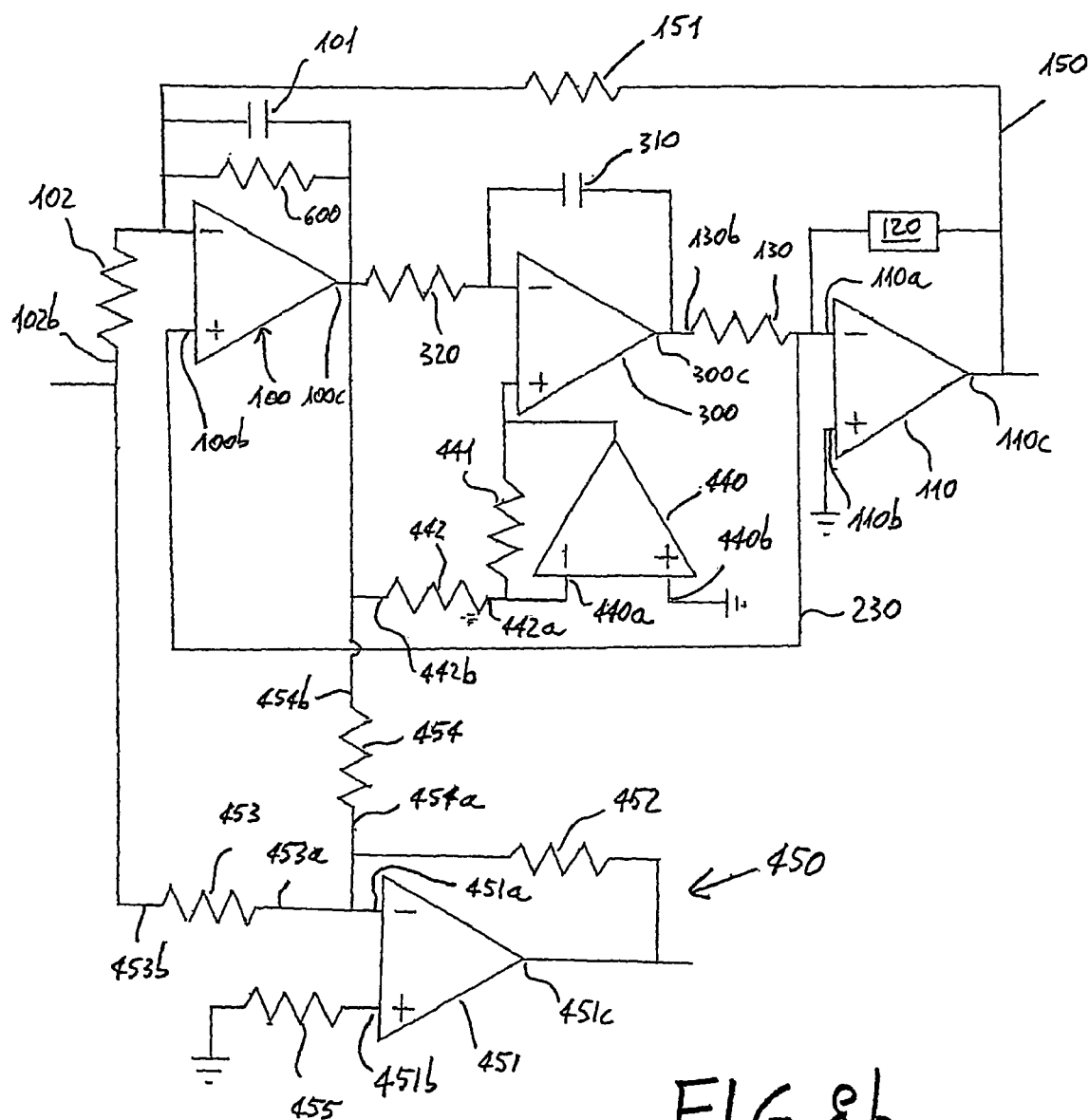

Referring particularly to FIG. 8*a*, the connecting means 400 consists of a resistive voltage divider 430; the latter is advantageously formed of a first resistor 410 having one end 410*a* connected with the output 100*c* of the main operational amplifier 100, and a second end 410*b* connected with the noninverting input 300*b* of the first connecting operational amplifier 300, and of a second resistor 420 having one end 420*a* connected with the noninverting input 300*b* of the operational amplifier 300 and a second end 420*b* connected to a fixed-potential node (preferably to the ground).

By means of the just described circuit structure it is obtained that a signal substantially proportional to the first signal 200—picked up from the output 100*c* of the main operational amplifier 100—be fed to the noninverting input 300*b* of the first connecting operational amplifier 300.

Alternatively, should it appear from a circuit analysis that a 180° phase shift is necessary between the first signal 200 and the signal at the noninverting input 300*b*, the connecting means 400 may comprise a second connecting operational amplifier 440 disposed in an inverting configuration: a feedback resistor 441 is connected between an output 440*c* and an inverting input 440*a* of the second connecting operational amplifier 440, whereas an input resistor 442 has one end 442*a* connected with the inverting input 440*a* of the operational amplifier 440, and a second end connected with the output 100*c* of the main operational amplifier 100.

The noninverting input 440*b* of the second connecting operational amplifier 440 is connected to a fixed-potential node, preferably to the ground.

In this way, the signal at the noninverting input 300*b* of the first connecting operational amplifier 300 is proportional to and has the opposite sign with respect to the first signal 200 picked up at the output 100*c* of the main operational amplifier 100 through the above mentioned input resistor 442.

Finally, in order to also provide the second embodiment of the active filter 1 in accordance with the invention (shown in FIGS. 5, 5*a*–5*b*, 6, 8*a*–8*b*) with an output of the notch type, filter 1 may also comprise a filtering stage 450.

The filtering stage 450 is provided with a filtering operational amplifier 451 having an inverting input 451*a*, a noninverting input 451*b* and an output 451*c*; the filtering operational amplifier 451 is fed back by means of a feedback resistor 452 connected between the output 451*c* and the inverting input 451*a* of the filtering operational amplifier itself.

In addition, an input resistor 453 has one end 453*a* connected with the inverting input 451*a* of the filtering operational amplifier 451 and a second end 453*b* connected with the second end 102*b* of resistor 102; in this way, the same signal at the input of the inverting section of the main operational amplifier 100 is also supplied to the inverting section of the filtering operational amplifier 451.

To pick up the first output signal 200 from the main operational amplifier 100 a connecting resistor 454 is provided; the latter has one end 454*a* connected with the inverting input 451*a* of the filtering operational amplifier 451 and a second end 454*b* connected with the output 100*c* of the main operational amplifier 100.

An auxiliary resistor 455 is further connected between the noninverting input 451*b* of the filtering operational amplifier 451 and a fixed-potential node, preferably to the ground.

Practically, in known manner the filtering stage 450 carries out difference with change of sign between the starting signal supplied to the second end 102*b* of resistor 102 (and, through the latter, to the inverting input 100*a* of the main operational amplifier 100) and the first signal present at the output 100*c* of the main operational amplifier 100 thereby generating an output of the notch type.

The invention achieves important advantages.

First of all, the active filter in accordance with the present invention is able to compensate in an optimal manner for the non idealities introduced by the active elements present in the filter itself.

In particular, through the above described simple circuit expedients the effects due to parasitic poles can be compensated for in a rather precise manner, irrespective of the number of the parasitic poles themselves and the number of the amplification/filtering stages employed.

In other words, the active filter in accordance with the present invention has a behaviour quite similar to the mathematically foreseeable theoretical-ideal one.

In addition, in the specific application relating to resonant active filters, the active filter of the invention is characterised by a very high quality factor Q—which is very close to the theoretical Q—so that it is particularly precise and selective in the neighbourhood of the resonance frequency.

The invention claimed is:
1. An active filter comprising:
a main operational amplifier (100) having an inverting input (100*a*), a noninverting input (100*b*) and an output (100*c*);

a capacitor (101) having one end (101*a*) connected with the output (100*c*) of said main operational amplifier (100), and a second end (101*b*) connected with the inverting input (100*a*) of said main operational amplifier (100);

a resistor (102) having one end (102*a*) connected with the inverting input (100*a*) of said main operational amplifier (100) and a second end (102*b*) defining an input of said filter (1);

a secondary operational amplifier (110) having an inverting input (110*a*), a noninverting input (110*b*) and an output (110*c*), at least one of said outputs (100*c*, 110*c*) being an output of said filter (1);

feedback means (120) connected between the output (110*c*) of said secondary operational amplifier (110) and the inverting input (110*a*) of said secondary operational amplifier (110);

a resistor (130) having one end (130*a*) connected with the inverting input (110*a*) of said secondary operational amplifier (110) and a second end (130*b*) connected with the output (100*c*) of said main operational amplifier (100), wherein the noninverting input (100*b*) of said main operational amplifier (100) is connected with the inverting input (110*a*) of said secondary operational amplifier (110).

2. A filter as claimed in claim 1, further comprising an intermediate stage (140) having an input (140*a*) connected with the output (100*c*) of said main operational amplifier (100) and an output (140*b*) connected with the second end (130*b*) of the resistor (130), said intermediate stage (140) being arranged to receive a first input signal (200) generated by said main operational amplifier (100) and to output a corresponding second signal (210) to the secondary operational amplifier (110).

3. A filter as claimed in claim 2, wherein said intermediate stage (140) comprises a phase-shifting block (180) to obtain a predetermined phase shift between said first signal (200) and second signal (210) included between 150° and 210°, or included between 60° and 120°.

4. A filter as claimed in claim 3, further comprising a feed-back branch (150) equipped with a resistor (151) and having one end (150*a*) connected with the output (110*c*) of said secondary operational amplifier (110) and a second end (150*b*) connected with the inverting input (100*a*) of said main operational amplifier (100).

5. An active filter as claimed in claim 1, further comprising:
an output operational amplifier (160) having an inverting input (160*a*), a noninverting input (160*b*) and an output (160*c*);
a feedback component (161), connected between the output (160*c*) and the inverting input (160*a*) of said output operational amplifier (160);
a resistor (162) having one end (162*a*) connected with the inverting input (160*a*) of said output operational amplifier (160) and a second end (162*b*) connected with the output (110*c*) of said secondary operational amplifier (110), said noninverting input (110*b*) of said secondary operational amplifier (110) being connected with the inverting input (160*a*) of said output operational amplifier (160).

6. An active filter as claimed in claim 5, further comprising a second feedback branch (163) and having one end (163*a*) connected with the output (160*c*) of said output operational amplifier (160) and a second end (163*b*) connected with the inverting input (100*a*) of said main operational amplifier (100).

7. A filter as claimed in claim 2, wherein said intermediate stage (140) comprises:
a first connecting operational amplifier (300) having an inverting input (300*a*), a noninverting input (300*b*), and an output (300*c*);
a feedback capacitor (310) connected between the output (300*c*) and the inverting input (300*a*) of said first connecting operational amplifier (300);
an input resistor (320) having one end (320*a*) connected with the inverting input (300*a*) of the first connecting operational amplifier (300), and a second end (320*b*) connected with the output (100*c*) of said main operational amplifier (100);
connecting means (400) between the output (100*c*) of said main operational amplifier (100) and the noninverting input (300*b*) of said connecting operational amplifier (300).

8. A filter as claimed in claim 7, wherein said connecting means (400) comprises:
a first resistor (410) having one end (410*a*) connected with the output (100*c*) of said main operational amplifier (100), and a second end (410*b*) connected with the noninverting input (300*b*) of said first connecting operational amplifier (300);
a second resistor (420) having one end (420*a*) connected with the noninverting input (300*b*) of said first connecting operational amplifier (300), and a second end (420*b*) connected to a node of fixed potential,
said first and second resistors (410, 420) of said connecting means (400) defining a resistive voltage divider (430) arranged to feed a signal proportional to said first signal (200) to the noninverting input (300*b*) of said first connecting operational amplifier (300).

9. A filter as claimed in claim 7, wherein said connecting means (400) comprises:
a second connecting operational amplifier (440) having an inverting input (440*a*), a noninverting input (440*b*) and an output (440*c*);
a feedback resistor (441) connected between the output (440*c*) and the inverting input (440*a*) of said second connecting operational amplifier (440);
an input resistor (442) having one end (442*a*) connected with the inverting input (440*a*) of said second connecting operational amplifier (440) and a second end (442*b*) connected with the output (100*c*) of said main operational amplifier (100).

10. A filter as claimed in claim 1, further comprising a filtering stage (450) provided with:
a filtering operational amplifier (451) having an inverting input (451*a*), a noninverting input (451*b*), and an output (451*c*);
a feedback resistor (452) connected between the output (451*c*) and the inverting input (451*a*) of said filtering operational amplifier (451);
an input resistor (453) having one end (453*a*) connected with the inverting input (451*a*) of said filtering operational amplifier (451) and a second end (453*b*) connected with the second end (102*b*) of said resistor (102);
a connecting resistor (454) having one end (454*a*) connected with the inverting input (451*a*) of said filtering operational amplifier (451) and a second end (454*b*) connected with the output (100*c*) of said main operational amplifier (100);
an auxiliary resistor (455) connected between the noninverting input (451*b*) of said filtering operational amplifier (451) and a node of fixed potential.

11. An active filter as claimed in claim 1, comprising:
a first operational amplifier (10) having an inverting input (11), a noninverting input (12), and an output (13);
a feedback capacitor (14) connected between the output (13) and the inverting input (11) of the first operational amplifier (10);
a main resistor (15) having one end (15a) connected with the inverting input (11) of the first operational amplifier (10), a second end (15b) of the main resistor (15) being arranged to receive a main signal (90);
wherein said active filter further comprises a divider (20) having:
an input (21) arranged to receive an auxiliary signal (91);
a first connecting terminal (22) connected with the noninverting input (12) of the first operational amplifier (10) to feed a signal which is a function of said auxiliary signal (91), to said noninverting input (12), and
a second connecting terminal (23) connected to a node of fixed potential.

12. A filter as claimed in claim 11, wherein said divider (20) is of the resistive type, said signal fed to the noninverting input of the first operational amplifier (10) preferably being substantially proportional to said auxiliary signal (91).

13. A filter as claimed in claim 11, further comprising a processing stage (30) arranged to receive an input signal (92) and connected with said first operational amplifier (10) and with said divider (20) to correspondingly output said main signal (90) and auxiliary signal (91).

14. A filter as claimed in claim 13, wherein said processing stage (30) comprises:
a second operational amplifier (31) having an inverting input (31a), a noninverting input (31b), and an output (31c), said output being connected with the second end (15b) of said main resistor (15) to supply said main signal (90);
a feedback element (32) having one end (32a) connected with the output (31c) of said second operational amplifier (31) and a second end (32b) connected with the inverting input (31a) of said second operational amplifier (31);
an input resistor (33) having one end (33a) connected with the inverting input (31a) of said second operational amplifier (31) and a second end (33b) arranged to receive said input signal (92).

15. A filter as claimed in claim 14, wherein the output (31c) of said second operational amplifier (31) is further connected with the input (21) of said divider (20) to feed said auxiliary signal (91) to said divider (20), said main signal (90) and auxiliary signal (91) being substantially coincident.

16. A filter as claimed in claim 14, wherein the second end (33b) of said input resistor (33) is connected with the input (21) of said divider (20) to supply said auxiliary signal (91) to said divider (20), said auxiliary signal (91) being substantially coincident with said input signal (92).

17. A filter as claimed in claim 14, wherein said processing stage (30) further comprises a phase-shifting block (40) having an input (40a) connected with the output (31c) of said second operational amplifier (31) to receive said main signal (90), and an output (40b) connected with the input (21) of said divider (20) to feed said auxiliary signal (91), said phase-shifting block (40) being arranged to generate said auxiliary signal (91) depending on said main signal (90).

18. A filter as claimed in claim 13, further see comprising:
an input stage (50) arranged to receive a source signal (93) and to correspondingly output said input signal (92) destined to said processing stage (30);
a total feedback branch (60) having one end (60a) connected with the output (13) of the first operational amplifier (10), and a second end (60b) connected with an input of said input stage (50).

19. A filter as claimed in claim 18, further comprising an auxiliary feedback branch (61) having one end (61a) connected with the output (31c) of said second operational amplifier (31) and a second end (61b) connected with an input of said input stage (50).

20. A filter as claimed in claim 11, further comprising:
an output stage (70) having an input (70a) connected with the output (13) of said first operational amplifier (10), and an output (70b) to supply a corresponding output signal (94);
a secondary feedback branch (62) having one end (62a) connected with the output (70b) of said output stage (70) and a second end (62b) connected with the inverting input (51a) of said third operational amplifier (51).

21. A filter as claimed in claim 11, further comprising a correcting block (65) connected with the noninverting input (12) of said first operational amplifier (10) to compensate for offsetting of said first operational amplifier (10).

22. A filter as claimed in claim 21, wherein said correcting block (65) comprises a resistor (65a) and a capacitor (65b) connected with each other in parallel, said resistor (65a) and capacitor (65b) being interposed between the noninverting input (12) of said first operational amplifier (10) and the first connecting terminal (22) of said divider (20).

23. A filter as claimed in claim 18, wherein said input stage (50) comprises:
a third operational amplifier (51) having an inverting input (51a), a noninverting input (51b) and an output (51c);
a capacitor (52) having one end (52a) connected with the output (51c) of said operational amplifier (51) and a second end (52b) connected with the inverting input (51a) of said operational amplifier (51);
a resistor (53) having one end (53a) connected with the inverting input (51a) of said third operational amplifier (51) and a second end (53b) arranged to receive said source signal (93),
the second end (60b) of said total feedback branch (60) being connected with the inverting input (51a) of said third operational amplifier (51).

24. A filter as claimed in claim 23, wherein the noninverting input (51b) of said third operational amplifier (51) is connected with the inverting input (31a) of said second operational amplifier (31).

25. A filter as claimed in claim 23, further comprising a secondary stage (80) connected with said input stage (50) and comprising:
a fourth operational amplifier (81) connected with said third operational amplifier (51) and having an inverting input (81a), a noninverting input (81b), and an output (81c);
a first resistor (82) having one end (82a) connected with the output (81c) of said fourth operational amplifier (81) and a second end (82b) connected with the inverting input (81a) of said fourth operational amplifier (81);
a second resistor (83) having one end (83a) connected with the inverting input (81a) of said fourth operational amplifier (81), and a second end (83b) connected with the second end (53*b*) of the resistor (53) of the input stage (50) to input said source signal (93);

a third resistor (84) having one end (84*a*) connected with the noninverting input (81*b*) of said fourth operational amplifier (81), and a second end (84*b*) connected to a node of fixed potential;

a fourth resistor (85) having one end (85*a*) connected with the inverting input (81*a*) of the fourth operational amplifier (81), and a second end (85*b*) connected with the output (51*c*) of the third operational amplifier (51).

* * * * *